(12) United States Patent
Kim

(10) Patent No.: US 7,915,121 B1
(45) Date of Patent: Mar. 29, 2011

(54) METHOD FOR MANUFACTURING SEMICONDUCTOR DEVICE HAVING BURIED GATE

(75) Inventor: Young Deuk Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/649,622

(22) Filed: Dec. 30, 2009

(30) Foreign Application Priority Data

Dec. 9, 2009 (KR) .......................... 10-2009-0121765

(51) Int. Cl.
*H01L 21/336* (2006.01)
(52) U.S. Cl. ................. 438/259; 438/589; 257/E21.384
(58) Field of Classification Search .................. 438/296, 438/239, 589, 259
See application file for complete search history.

(56) References Cited

U.S. PATENT DOCUMENTS

| 7,595,262 | B2 * | 9/2009 | Schlosser | 438/585 |
|---|---|---|---|---|
| 7,723,191 | B2 * | 5/2010 | Kang et al. | 438/272 |
| 2003/0151068 | A1 * | 8/2003 | Ishibashi | 257/200 |
| 2007/0023784 | A1 * | 2/2007 | Schloesser | 257/208 |
| 2007/0075359 | A1 * | 4/2007 | Yoon et al. | 257/329 |
| 2007/0122976 | A1 * | 5/2007 | Kim | 438/259 |
| 2009/0108341 | A1 * | 4/2009 | Chung | 257/329 |
| 2009/0181520 | A1 * | 7/2009 | Li et al. | 438/462 |
| 2010/0120221 | A1 * | 5/2010 | Kang | 438/430 |
| 2010/0193901 | A1 * | 8/2010 | Jang et al. | 257/520 |
| 2010/0240184 | A1 * | 9/2010 | Jung et al. | 438/270 |
| 2010/0258860 | A1 * | 10/2010 | Kim et al. | 257/330 |
| 2010/0270602 | A1 * | 10/2010 | Choi | 257/296 |

* cited by examiner

*Primary Examiner* — Savitri Mulpuri
(74) *Attorney, Agent, or Firm* — Ladas & Parry LLP

(57) ABSTRACT

A method for manufacturing a semiconductor device having a buried gate is provided. A gate conductive layer is first formed in the peri region before a bit line contact is formed in the cell region, so that a fabrication process is simplified and the problem caused by a step height between the cell region and the core/peri region is not encountered.

14 Claims, 6 Drawing Sheets

METHOD FOR MANUFACTURING SEMICONDUCTOR DEVICE HAVING BURIED GATE

CROSS-REFERENCE TO RELATED APPLICATION

The priority of Korean patent application No. 10-2009-0121765 filed on Dec. 9, 2009, the disclosure of which is hereby incorporated in its entirety by reference, is claimed.

BACKGROUND OF THE INVENTION

Embodiments of the present invention relate to a method for manufacturing a semiconductor device, and more particularly to a method for manufacturing a semiconductor device, such that a fabrication process of the semiconductor device having a buried gate is simplified and the number of problems caused by such a fabrication process is minimized.

With the increasing integration degree of a semiconductor memory device such as a Dynamic Random Access Memory (DRAM), an area occupied by a Metal Oxide Semiconductor (MOS) transistor is gradually decreasing. As a result, a channel length of the MOS transistor is also decreasing, resulting in the occurrence of a short channel effect. Specifically, if a short channel effect occurs in an access MOS transistor used in a memory cell of the DRAM, a threshold voltage of the DRAM cell is decreased, and a leakage current of the DRAM cell is increased, such that refresh characteristics of the DRAM is consequently decreased.

Therefore, as an improved MOS transistor capable of restricting the short channel effect regardless of the increasing integration degree of the memory device, a recess gate MOS transistor having a longer channel length has recently been proposed.

However, a highly-integrated semiconductor device, such as a highly-integrated DRAM based on 60 nm technology, has difficulty in obtaining desired requirements using only the recess gate MOS transistor. Specifically, as the technology level moves close to a level of 40 nm or less, it is difficult to form a gate structure, a bit line structure, a contact structure, and the like. Although it is assumed that such structures can be formed, it is also difficult to obtain a resistance characteristic, a refresh characteristic, a guarantee of low fails, and a breakdown voltage characteristic that are capable of satisfying element characteristics of the semiconductor device.

Accordingly, in order to increase the integration degree, reduce the number of fabrication processes, and improve element characteristics such as a leakage characteristic, an improved semiconductor device having a buried gate has recently been developed and come into the market.

A semiconductor device having a buried gate is buried under the surface of the semiconductor substrate, so that it provides a relatively long effective channel length. A method for manufacturing the buried gate forms a trench and buries a gate in the trench, so that interference between a bit line and a gate can be minimized and the number of stacked films can be decreased. In addition, capacitance of the entire cell is decreased so that refresh characteristics can be increased.

However, in accordance with the conventional semiconductor device having such a buried gate, a gate of the core/peri region is formed on a semiconductor substrate whereas a gate of the cell region is buried in the semiconductor substrate, so that there is a difference in height (i.e., a step height) between the cell region and the core/peri region.

In accordance with the related art for solving the step height problem, a bit line of the cell region and the gate of the core/peri region are simultaneously formed.

However, according to the above-mentioned related art, a poly part for forming the bit line of the cell region and another poly part for forming the gate of the core/peri region are excessively deposited in the vicinity of a boundary between the cell region and the core/peri region, so that a variety of problems are unexpectedly encountered when the excessively deposited poly parts are removed.

BRIEF SUMMARY OF THE INVENTION

Various embodiments of the present invention are directed to providing a method for manufacturing a semiconductor device having a buried gate that substantially obviates one or more problems due to limitations and disadvantages of the related art.

An aspect or embodiment of the present invention is to provide a method for reducing the number of fabrication processes needed for a semiconductor device having a buried gate by improving such fabrication processes, so that it prevents the problems caused by the step height between a cell region and a core/peri region.

In accordance with an aspect or embodiment of the present invention, a method for manufacturing a semiconductor device having a buried gate includes forming a buried gate in a cell region; after forming a gate conductive layer in the cell region and a peri region, removing the gate conductive layer of the cell region using an cell-region open mask; forming a bit line contact in the cell region from which the gate conductive layer is removed; forming a bit line conductive layer on the cell region and the peri region; and forming a bit line in the cell region by patterning the bit line conductive layer and the gate conductive layer, and forming a gate in the peri region.

A gate conductive layer, for example, may be formed in the peri region before a bit line contact is formed in the cell region, so that a fabrication process is simplified and the problem caused by a step height between the cell region and the core/peri region is not generated.

The forming of the buried gate in the cell region may include: forming a pad nitride layer on a substrate; forming a device isolation layer to define an active region by etching the pad nitride layer and the substrate; forming a hard mask layer on the pad nitride layer and the device isolation layer; forming a hard mask pattern to form a gate region by etching the hard mask layer and the pad nitride layer; forming a trench by etching the substrate using the hard mask pattern as a mask; and forming a conductive layer buried in some areas of the trench, for example.

The method may further include, for example, after forming the device isolation layer, forming a well by implanting impurities into the active region through the pad nitride layer.

The hard mask layer may be configured in a form of a stacked structure of an amorphous carbon layer (ACL) and a silicon oxide nitride (SiON) layer, for example.

The method may further include, for example, after forming a sealing layer over the trench and the pad nitride layer such that the conductive layer is completely buried, removing the sealing layer and the pad nitride layer such that the sealing layer remains only over the conductive layer.

The forming of the bit line contact in the cell region having no gate conductive layer may include, for example: forming an insulating layer not only in the cell region from which the gate conductive layer is removed, but also over the gate conductive layer; planarizing the insulating layer in a manner that the insulating layer remains over the gate conductive layer;

forming a hard mask layer on the planarized insulating layer; selectively etching the hard mask layer of the cell region and the insulating layer, and thus forming a bit line contact hole to expose a substrate; and burying a bit line contact material in the bit line contact hole.

The forming of the bit line contact in the cell region having no gate conductive layer may include: forming an insulating layer not only in the cell region from which the gate conductive layer is removed, but also over the gate conductive layer; forming a spin on coating (SOC) layer on the insulating layer; selectively etching the spin on coating (SOC) layer of the cell region and the insulating layer, and thus forming a bit line contact hole to expose a substrate; and burying a bit line contact material in the bit line contact hole, for example.

The forming of the bit line contact hole may include, for example: forming a first bit line contact hole having a diameter larger than a target size; and forming a spacer on inner sidewalls of the first bit line contact hole.

The method may further include, after forming the bit line contact, cleaning the insulating layer remaining on the gate conductive layer, for example.

The hard mask layer, for example, may be configured in a form of a stacked structure of an amorphous carbon layer (ACL) and a silicon oxide nitride (SiON) layer.

The bit line conductive layer may be configured in a form of a stacked structure of a barrier metal layer and a tungsten layer, for example.

The barrier metal layer, for example, may be formed of a titanium (Ti) layer, a titanium nitride (TiN) layer, WN, WSiN or a stacked structure thereof.

DESCRIPTION OF EMBODIMENTS

As required, detailed embodiments of the present invention are disclosed herein. However, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Reference will now be made in detail to the embodiments of the present invention, examples of which are illustrated in the accompanying drawings. Wherever possible, the same reference numbers will be used throughout the drawings to refer to the same or like parts.

FIGS. 1 to 11 are cross-sectional views illustrating a semiconductor device including a buried gate according to an embodiment of the present invention.

Figure 1:
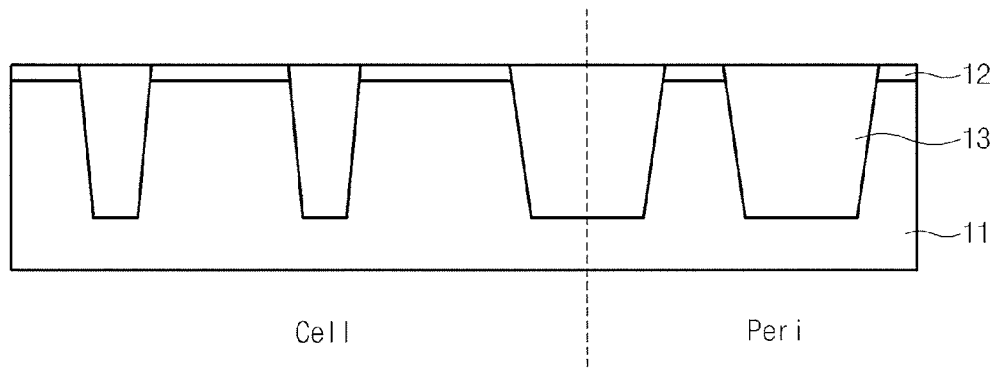
FIGS. 1 to 11 are cross-sectional views illustrating a semiconductor device including a buried gate according to an embodiment of the present invention.

Referring to FIG. 1, a pad oxide layer (not shown) and a pad nitride layer 12 are sequentially deposited on a substrate 11 including a cell region and a core/peri region (hereinafter referred to as a peri area).

Next, a device isolation layer 13 is formed by a Shallow Trench Isolation (STI) process. That is, a trench (not shown) for forming a device isolation region that defines an active region in the substrate 11 is formed by an etching process using an STI mask. Subsequently, an insulating layer is formed to be buried in the trench, and the insulating layer is Chemical Mechanical Polishing (CMP)-processed until the pad nitride layer 12 is exposed so that a device isolation layer 13 is formed.

The device isolation layer 13, for example, may be formed by a single gap-filling process based on a flowable oxide layer. Otherwise, the device isolation layer 13 may be configured in the form of a combination (e.g., a stacked form) of the flowable oxide layer and the deposition oxide layer, for example. In this case, the flowable oxide layer may include a Spin On Dielectric (SOD) and the deposition oxide layer may include a High Density Plasma (HDP) oxide layer, for example. Prior to forming the device isolation layer 13, for example, a sidewall oxide layer (not shown) may be formed by a wall oxidation process, and a liner nitride layer (not shown) may be formed on the sidewall oxide layer as necessary.

Figure 2:
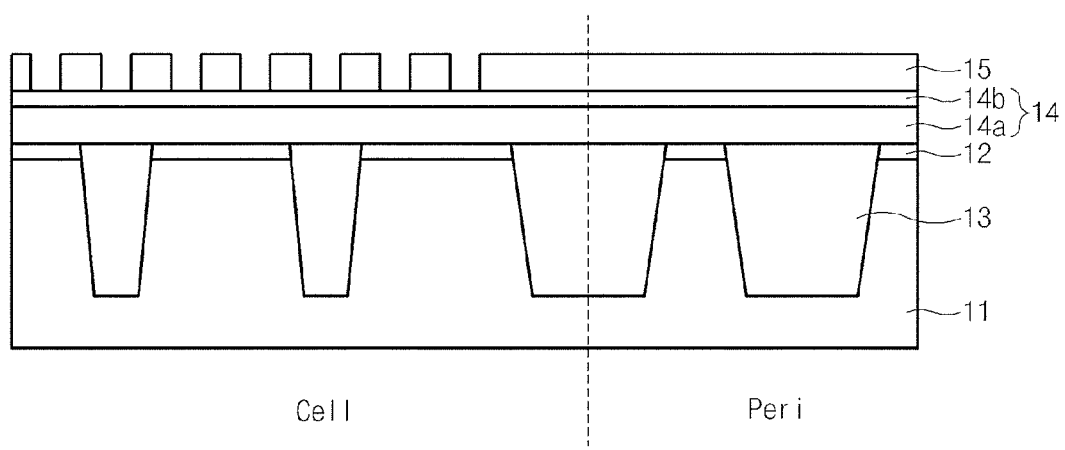

Referring to FIG. 2, impurities are implanted in the active region of the cell region so that a Deep N+Well (DNW) is formed.

The embodiment of the present invention forms a well under the condition that the nitride layer 12 is present on the substrate 11, whereas the related art removes the nitride layer 12 and implants impurities in the active region so as to form the well. Such impurity implantation is made available by adjusting the dose of impurity. In this way, the present invention again uses the nitride layer 12 having been used to form the device isolation layer 13 as a hard mask nitride layer in a subsequent process for forming a trench needed for a buried gate. Therefore, the embodiment of the present invention need not re-form the hard mask nitride layer for the buried gate, resulting in a simplified fabrication process.

After that, a hard mask layer 14 is formed on the pad nitride layer 12 and the device isolation layer 13, and a photoresist pattern 15 for defining the buried gate area in the cell region is formed on the hard mask layer 14. In this case, the hard mask layer 14 may be configured in a stacked form of an amorphous carbon layer (ACL) 14a and an SiON layer 14b, for example.

Figure 3:
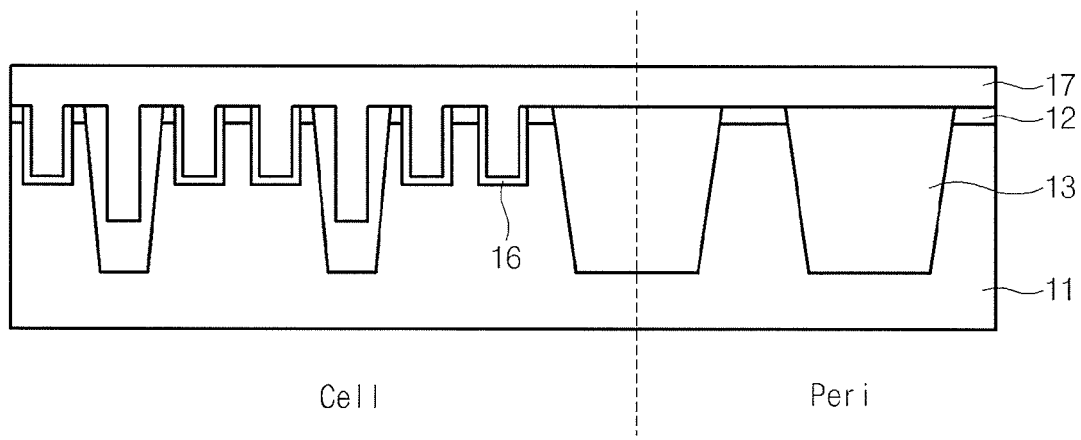

Referring to FIG. 3, the hard mask layer 14 and the pad nitride layer 12 are etched using the photoresist pattern 15 as an etch mask, so that a hard mask pattern (not shown) is formed. Subsequently, the photoresist pattern 15 is removed, and the silicon substrate 11 is etched using the hard mask pattern as an etch mask, such that a trench (not shown) for forming the buried gate is formed.

In this case, for example, the trench may be formed by etching not only the active region of the substrate but also the device isolation layer 13. Generally, a gate is configured in the form of a line, so that the active region and the device isolation layer 13 are simultaneously etched so that a line-type trench is formed. In this case, the active region and the device isolation layer 13 have different etch selection ratios, so that the device isolation layer 13 is more deeply etched. That is, the active region is configured in the form of a fin gate, such that it is more protruded than the device isolation layer 13 in the gate region.

Next, an oxide layer 16 is formed on an inner lateral surface of the trench by the execution of the oxidation process, so that a metal layer 17 is formed to be buried in the trench. In this case, the metal layer 17 may include a titanium nitride layer (TiN), a tantalum nitride layer (TaN), a tungsten (W), and the like, for example. For example, in order to reduce resistance of the metal layer 17, a thin titanium nitride layer (TiN) (or a tantalum nitride layer (TaN)) may be conformably deposited, and the tungsten layer (W) may be used for gapfilling in such a manner that the metal layer 17 having low resistance is formed. Alternatively, the metal layer 17 may be formed by depositing the titanium nitride layer (TiN) and the tantalum nitride layer (TaN), or may also be formed by sequentially depositing the titanium nitride layer (TiN), the tantalum nitride layer (TaN), and the tungsten layer (W), for example.

Figure 4:
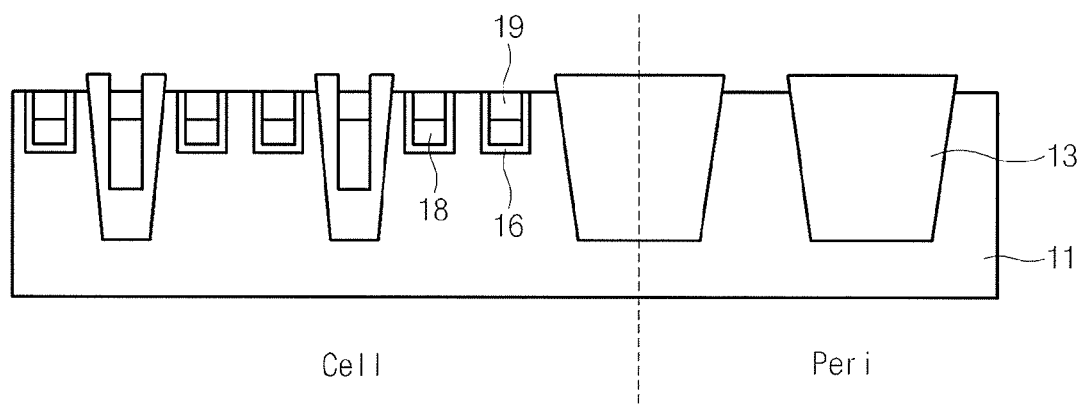

Referring to FIG. 4, the metal layer 17 is planarized by CMP or the like so that the pad nitride layer 12 is exposed. Then, the metal layer 17 is etched-back and cleaned in such a manner that the metal layer 17 is buried in only some parts of the trench, so that a buried gate 18 is formed. In this case, the etch-back process is continuously conducted, until the surface of the metal layer 17 becomes lower than the surface of the substrate 11 and the desired height of the buried gate 18 is obtained.

Subsequently, a sealing layer 19 for sealing an upper part of the buried gate 18 is formed. In this case, for example, the sealing layer 19 is formed of a nitride layer to protect the buried gate 18.

For example, after the nitride layer is sealed in a manner that the buried gate 18 is completely filled with the nitride layer, the nitride layer 19 is selectively removed by a strip process, so that the nitride layer (sealing layer) remains only over the buried gate 18. When the nitride layer 19 is removed, the pad nitride layer 12 is also removed. That is, the embodiment of the present invention simultaneously removes the sealing layer 19 and the nitride layer 12, thereby removing the pad nitride layer 12 without using an additional process, resulting in the implementation of a simplified fabrication process.

In addition, the sealing layer 19 remains only over the buried gate 18 whereas it does not remain over the semiconductor substrate 11 of the active region, so that a Critical Dimension (CD) of the contact hole bottom can be easily guaranteed in the subsequent process for forming the bit line contact and the storage node contact.

Figure 5:
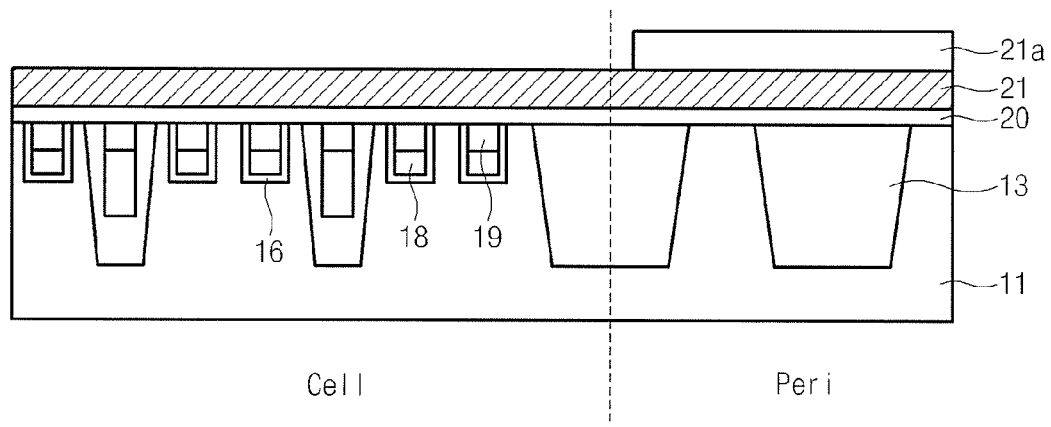

Referring to FIG. 5, impurities for forming a channel are implanted in the active region of the peripheral region (i.e., peri region), and a gate oxide layer 20 and a gate conductive layer 21 are sequentially formed over the entire surface of the cell region and the peri region. In this case, for example, the gate conductive layer 21 may be formed of a polysilicon layer as necessary.

Next, a photoresist layer (not shown) is formed over the gate conductive layer 21, and a photoresist pattern 21a for opening only the cell region is formed using a cell-region open mask.

Figure 6:
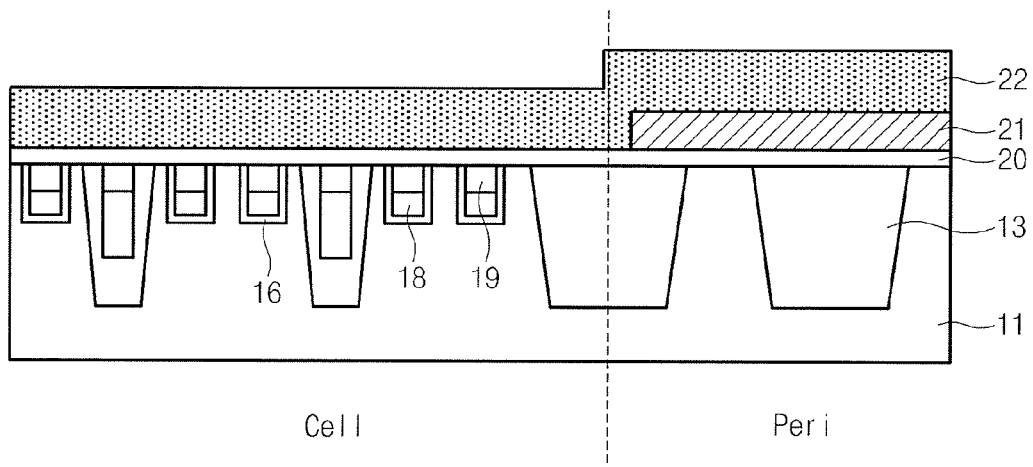

Referring to FIG. 6, the gate conductive layer 21 of the cell region is removed using the photoresist pattern 21a as a mask, so that only the conductive layer 21 for forming the gate remains in the peri region.

After that, an insulating layer 22 is formed over the entire surface of the cell region and the peri region. In this case, the insulating layer 22 may be formed of an oxide layer, for example.

As described above, according to the embodiment of the present invention, the conductive layer 21 for forming the gate in the peri region is formed prior to the contact forming process. Therefore, although the step height between the cell region and the peri region is generated, the embodiment of the present invention can prevent a conductive layer (poly) for forming a contact and another conductive layer (poly) for forming a gate in the peri region from being deposited in the vicinity of a boundary between the cell region and the peri region. As a result, the embodiment of the present invention need not perform the planarization process needed for removing such poly parts that have been unnecessarily deposited at the boundary between the cell region and the peri region.

Figure 7:
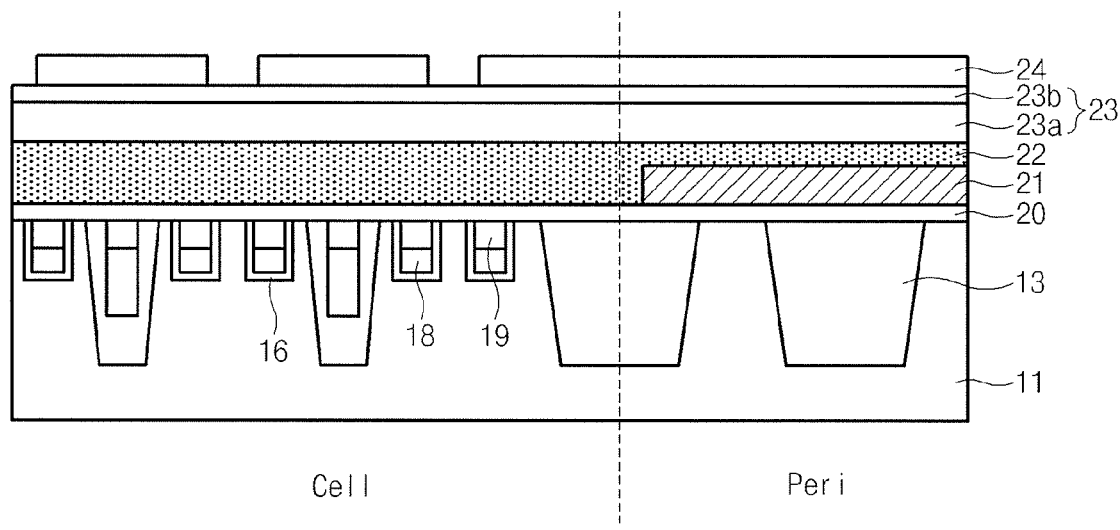

Referring to FIG. 7, the insulating layer 22 is planarized by CMP or the like, such that the insulating layer 22 having a predetermined thickness remains on the gate conductive layer 21. In this case, the reason the insulating layer 22 having a predetermined thickness remains on the gate conductive layer 21 of the peri region is to prevent the gate conductive layer 21 from being damaged in a subsequent process.

Next, a hard mask layer 23 is formed on the insulating layer 22, and a photoresist pattern 24 for defining a bit line contact area of the cell region is formed on the hard mask layer 23. In this case, the hard mask layer 23, for example, may be configured in a stacked form of an amorphous carbon layer (ACL) 23a and a silicon oxide nitride (SiON) layer 23b.

Figure 8:
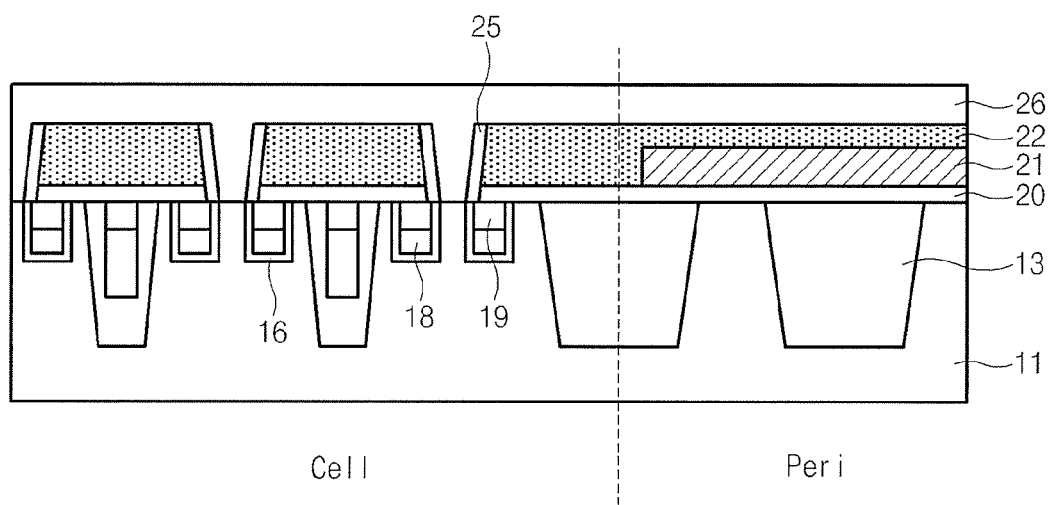

Referring to FIG. 8, the hard mask layer 23, the insulating layer 22, and the gate oxide layer 20 are sequentially and selectively etched until the substrate 11 is exposed using the photoresist pattern 24 as an etch mask, such that the bit line contact hole (not shown) is formed. In this case, the open area of a bit line contact hole is larger than a target contact hole to be actually formed, for example.

Next, the nitride layer (not shown) is formed on the inner lateral surface of the bit line contact hole and over the insulating layer 22, and is etched back, so that a bit line contact spacer 25 is formed on a lateral surface of the bit line contact hole.

In other words, as the integration degree of the semiconductor device increases, the height of a contact is increased whereas the contact hole is reduced. As a result, the contact hole may not be opened or the actually opened area is small so that contact resistance is unavoidably increased. In order to solve the above-mentioned problems, in accordance with the embodiment of the present invention, the open area of the contact hole is larger than the actually desired area, so that the not-open problem of the contact hole and the increasing contact resistance are solved, and a spacer 25 is formed on sidewalls of the contact hole and consequently a contact hole having a desired size is formed.

Next, a bit line contact material layer 26 is formed to be buried in the bit line contact hole. In this case, the bit line contact material layer 26 may be formed of a polysilicon layer, for example.

Figure 9:
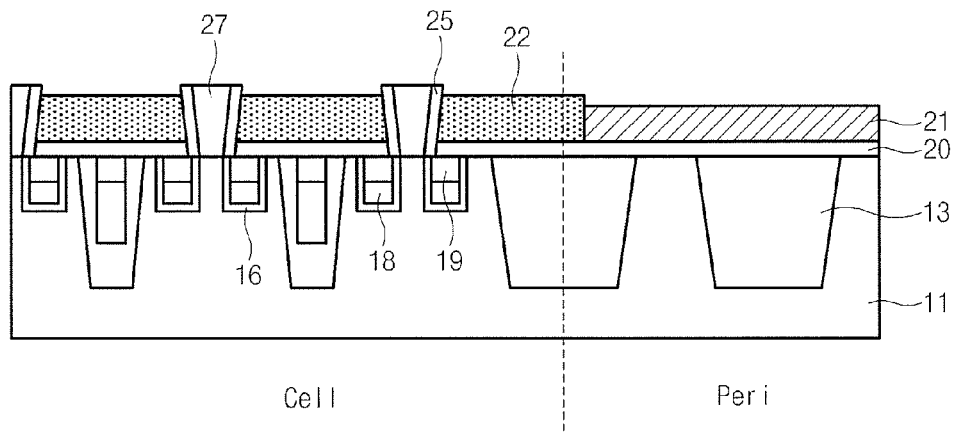

Referring to FIG. 9, the bit line contact material layer 26 is etched back or CMP-processed until the insulating layer 22 is exposed, so that a bit line contact 27 is formed. While the bit line contact material layer 26 is removed, the gate conductive layer 21 is protected by the insulating layer 22 formed thereon, so that it is not damaged.

After that, the insulating layer 22 remaining over the gate conductive layer 21 is removed from the peri region by a cleaning process, so that the gate conductive layer 21 is exposed.

Figure 10:
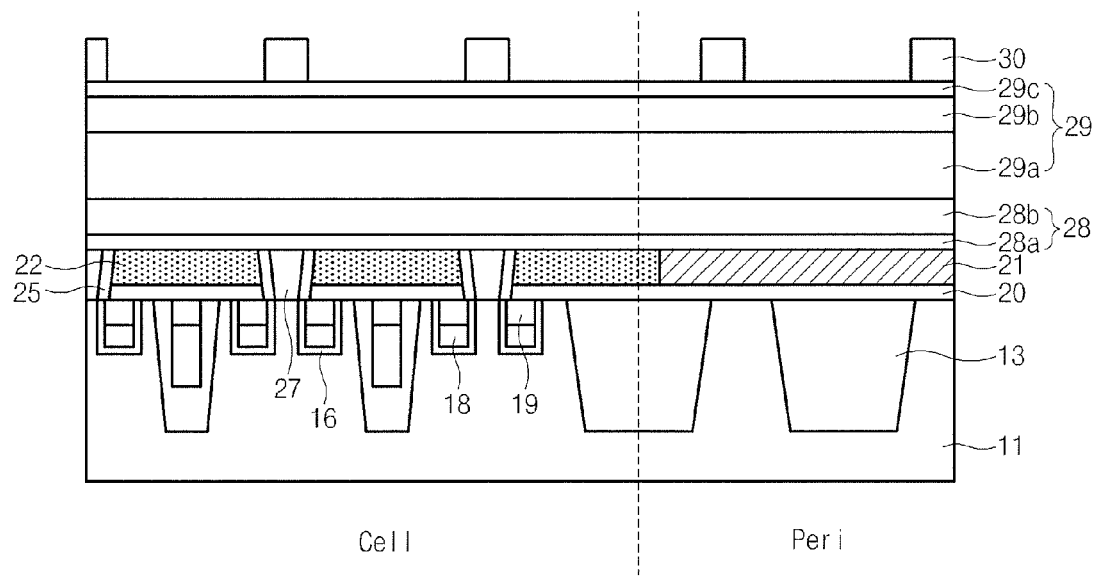

Referring to FIG. 10, a bit line conductive layer 28 and a hard mask layer 29 are sequentially deposited on the gate conductive layer 21, the insulating layer 22, and the bit line contact 27. In this case, the bit line conductive layer 28 may be formed of a stacked structure of a barrier metal layer 28a and a tungsten layer 28b, for example. The barrier metal layer 28a, for example, may be formed of Ti, TiN, WN or WSiN, or a stacked structure of any of Ti, TiN, WN and WSiN. In addition, the hard mask layer 29 may be formed of a stacked structure of a nitride layer 29a, an ACL 29b and a SiON layer 29c, for example.

Next, a photoresist pattern 30 for defining the bit line area in the cell region and defining the gate region in the peri region is formed over the hard mask layer 29.

Figure 11:
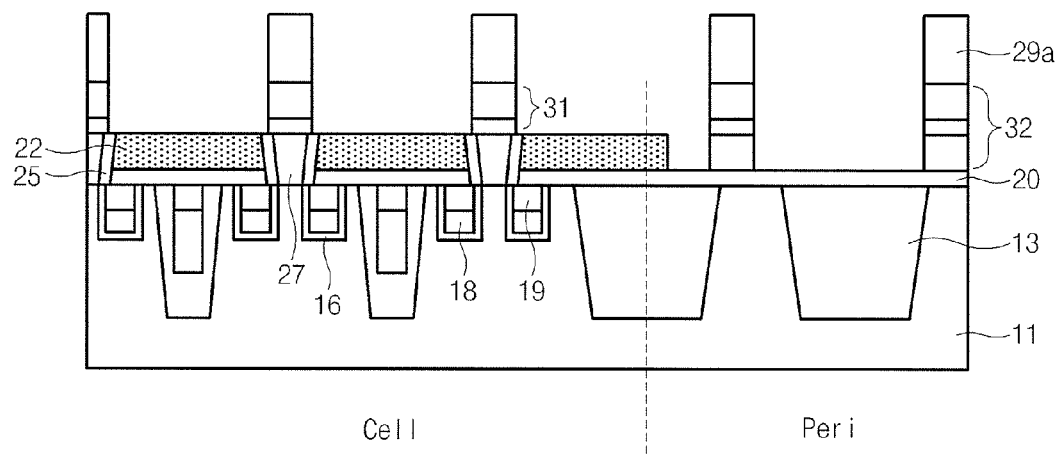

Referring to FIG. 11, the hard mask layer 29 is etched using the photoresist pattern 30 as a mask so that a hard mask layer pattern (not shown) is formed. Subsequently, the bit line conductive layer 28 is etched in the cell region using the hard mask layer pattern as a mask, so that a bit line pattern 31 is formed. The bit line conductive layer 28 and the gate conductive layer 21 are etched in the peri region so that a gate pattern 32 is formed.

In accordance with the embodiments of the present invention, no nitride layer is formed on the silicon substrate 11 of a junction area even in a subsequent process for forming a storage node contact, so that a critical dimension (CD) of the bottom of the contact hole can be easily guaranteed.

Although the present invention has been disclosed by referring to the above-mentioned embodiments, it should be noted that the aforementioned embodiments have been disclosed for only illustrative purposes, and those skilled in the art will appreciate that various modifications, additions and substitutions are possible, without departing from the scope and spirit of the invention as disclosed in the accompanying claims. Thus, it is intended that the present invention covers the modifications and variations of this invention provided they come within the scope of the appended claims and their equivalents.

Figure 12:
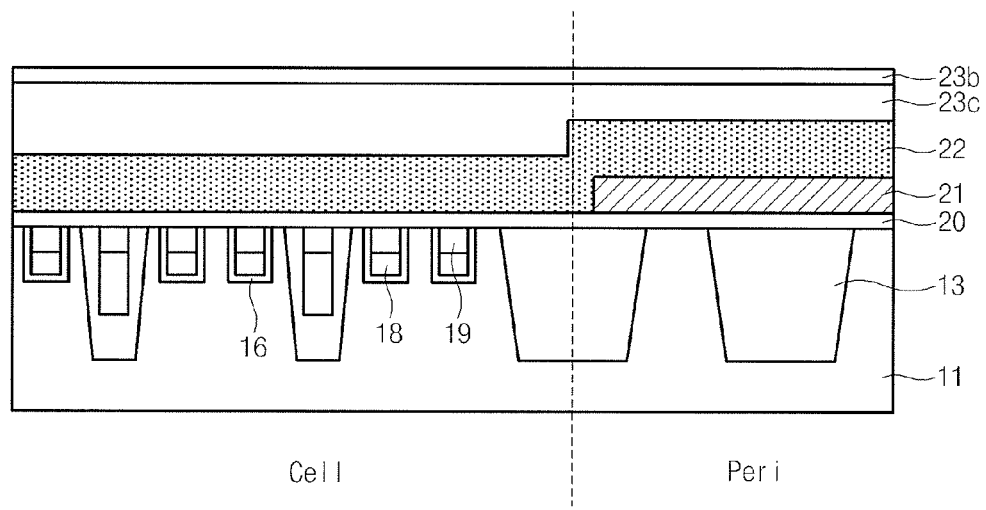
FIG. 12 is a cross-sectional view illustrating a semiconductor device according to another embodiment of the present invention.

For example, the insulating layer 22 is planarized by CMP or the like to remove a step height of the insulating layer 22. Alternately, in accordance with another embodiment of the present invention, as shown in FIG. 12, the insulating layer 22 is not planarized and a spin on coating (SOC) layer 23c instead of an ACL 23a is formed on the insulating layer 22, so that the surface of the SOC layer 23c can be planarized, for example.

As apparent from the above description, embodiments of the present invention prevent the problem caused by the step height between the cell region and the core/peri region when the semiconductor device is manufactured, simplifying a fabrication process of the semiconductor device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device having a buried gate comprising the steps of:
    forming a buried gate in a cell region;
    forming a gate conductive layer in the cell region and a peri region;
    removing the gate conductive layer of the cell region using a cell-region open mask;
    forming a bit line contact in the cell region from which the gate conductive layer is removed;
    forming a bit line conductive layer on the cell region and the peri region; and
    forming a bit line in the cell region by patterning the bit line conductive layer and the gate conductive layer, and forming a gate in the peri region.

2. The method according to claim 1, wherein the step of forming the buried gate in the cell region includes:
    forming a pad nitride layer on a substrate;
    forming a device isolation layer to define an active region by etching the pad nitride layer and the substrate;
    forming a hard mask layer on the pad nitride layer and the device isolation layer;
    forming a hard mask pattern to form a gate region by etching the hard mask layer and the pad nitride layer;
    forming a trench by etching the substrate using the hard mask pattern as a mask; and
    forming a conductive layer buried in at least one portion of the trench.

3. The method according to claim 2, further comprising:
    after forming the device isolation layer, forming a well by implanting impurities into the active region through the pad nitride layer.

4. The method according to claim 2, wherein the hard mask layer is configured in a form of a stacked structure of an amorphous carbon layer (ACL) and a silicon oxide nitride (SiON) layer.

5. The method according to claim 2, further comprising:
    forming a sealing layer over the trench and the pad nitride layer such that the conductive layer is completely buried; and
    removing the sealing layer and the pad nitride layer such that the sealing layer remains only over the conductive layer.

6. The method according to claim 1, wherein the step of forming the bit line contact in the cell region having no gate conductive layer includes:
    forming an insulating layer in the cell region from which the gate conductive layer is removed and over the gate conductive layer;
    planarizing the insulating layer in a manner that the insulating layer remains over the gate conductive layer;
    forming a hard mask layer on the planarized insulating layer;
    selectively etching the hard mask layer of the cell region and the insulating layer, thus forming a bit line contact hole to expose a substrate; and
    burying a bit line contact material in the bit line contact hole.

7. The method according to claim 6, wherein the hard mask layer is configured in a form of a stacked structure of an amorphous carbon layer (ACL) and a silicon oxide nitride (SiON) layer.

8. The method according to claim 6, further comprising:
    after forming the bit line contact, cleaning the insulating layer remaining on the gate conductive layer.

9. The method according to claim 6, wherein the step of forming the bit line contact hole includes:
    forming a first bit line contact hole having a diameter larger than a target size; and
    forming a spacer on inner sidewalls of the first bit line contact hole.

10. The method according to claim 1, wherein the step of forming the bit line contact in the cell region having no gate conductive layer includes:
    forming an insulating layer in the cell region from which the gate conductive layer is removed and over the gate conductive layer;
    forming a spin on coating (SOC) layer on the insulating layer;
    selectively etching the spin on coating (SOC) layer of the cell region and the insulating layer, thus forming a bit line contact hole to expose a substrate; and
    burying a bit line contact material in the bit line contact hole.

11. The method according to claim 10, further comprising:
    after forming the bit line contact, cleaning the insulating layer remaining on the gate conductive layer.

12. The method according to claim 10, wherein the step of forming the bit line contact hole includes:
    forming a first bit line contact hole having a diameter larger than a target size; and forming a spacer on inner sidewalls of the first bit line contact hole.

13. The method according to claim 1, wherein the bit line conductive layer is configured in a form of a stacked structure of a barrier metal layer and a tungsten layer.

14. The method according to claim 13, wherein the barrier metal layer is formed of a titanium (Ti) layer, a titanium nitride (TiN) layer, WN, WSiN or a stacked structure thereof.

* * * * *